United States Patent Office 3,253,160
Patented May 24, 1966

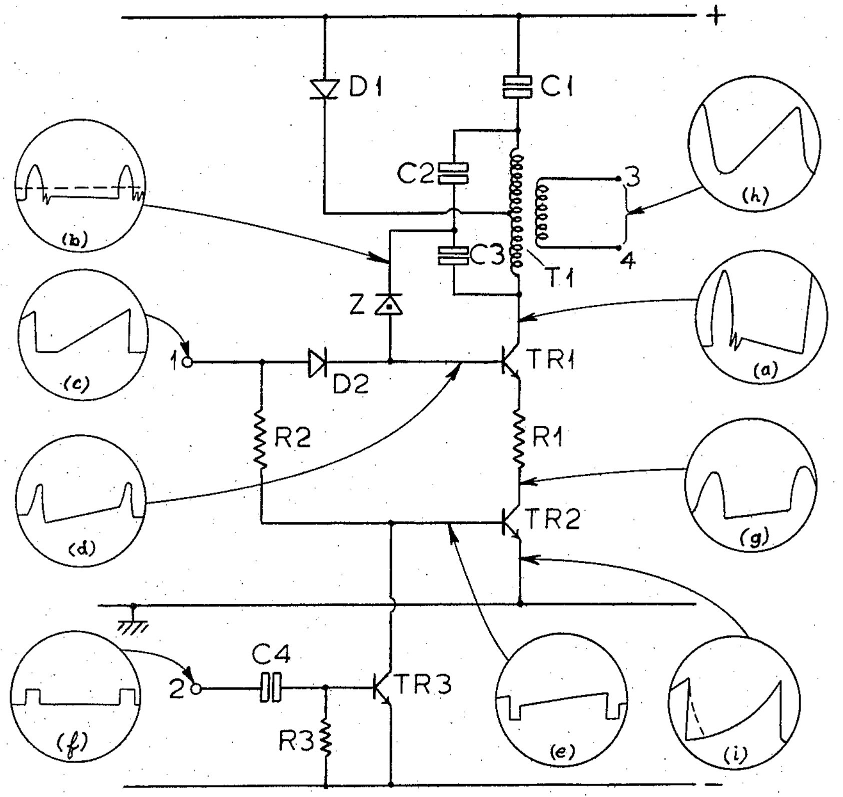
+
D1
C1
C2
3
C3
4
T1
Z
1
D2
TR1
R2
R1
TR2
C4
2
TR3
R3
−
(a)
(b)
(c)
(d)
(e)
(f)
(g)
(h)
(i)

3,253,160
TRANSISTOR CIRCUITS

Ronald Charles Hall, Cowley, Middlesex, Graham John Guy Hicks, Newhaven, Sussex, and Alan Herbert Pratt, Uxbridge, Middlesex, England, assignors to Electric & Musical Industries Limited, Hayes, Middlesex, England, a company of Great Britain Filed Aug. 15, 1963, Ser. No. 302,386
Claims priority, application Great Britain, Aug. 16, 1962, 31,460/62
12 Claims. (Cl. 307—88.5)

The present invention relates to transistor circuits and has particular but not exclusive reference to line scanning circuits for television tubes.

Because of the limited collector-to-base break-down voltage rating of the majority of transistors a line scanning circuit using transistors and conventional in design in that a single transistor is used in the output circuit would involve very high currents in order to keep the peak retrace voltage sufficiently low to be within the collector-to-base break-down voltage of the transistor. Difficulties obviously result in such an arrangement due to the problem of smoothing the power supplies where high current at low voltage is required. It has therefore been proposed to use two transistors in series in the output stage of the line scanning circuit thus enabling higher voltages and correspondingly lower currents to be used and moreover dividing the peak voltage on retrace equally between the two transistors, thus permitting a voltage of twice the maximum rated voltage of each transistor. In one proposed arrangement the two transistors are transformer driven and operate in the switching mode, the retrace voltage being applied directly to the interconnection point of the transistors from the energy recovery diode tap on the primary winding of the line output transformer. A number of disadvantages, however, result from this proposed arrangement. In particular, because the transistors operate in the switching mode linearity correction must be carried out entirely in the secondary circuit. Also to obtain equal division of voltage between the two transistors during the retrace time the diode tap must of necessity be a centre tap in the secondary winding of the transformer which has a limitation upon the design of the circuit. Similarly, the application of the retrace voltage pulse directly to the interconnection point of the two transistors can cause loss of energy recovery if the lower transistor of the pair does not present a very high impedance during retrace time.

It is one object of the present invention to produce a circuit in which these disadvantages are substantially reduced.

According to one aspect of the present invention there is provided a circuit arrangement comprising an inductive load, a transistor amplifier connected in series with said load, and an input terminal connected to said amplifier to which an input signal may be applied to produce a sawtooth current in said load, wherein said transistor amplifier comprises two transistors having their emitter collector paths in series, there being provided means connected to said load for producing a voltage intermediate between the voltages at the ends of said load and means for applying said intermediate voltage to the base of one of said transistors so that the voltage produced across said load during the retrace of said sawtooth is shared between said transistors, said applying means being such as to isolate said producing means from said base for at least part of the forward stroke of said sawtooth current.

In order that the present invention may be clearly understood and readily carried into effect, it will now be described with reference to the accompanying drawing, the single figure of which shows the circuit diagram of a television line scanning output circuit in accordance with one embodiment of the present invention together with waveforms present at various points of the circuit.

A line output transformer T1 has primary and secondary windings; the output terminals 3 and 4 of the secondary winding are available for connection to the scanning coils of a television pick-up tube not shown in the drawings and the primary winding is connected at its upper end through a boost capacitor C1 to a source of positive potential and at its lower end to the collector of a transistor TR1. The primary winding of the transformer T1 has a tapping which is connected through an energy recovery diode D1 to the positive potential supply. An input waveform is applied to the terminal 1 and thence through diode D2 to the base of the transistor TR1. The input waveform also passes through resistance R2 to the base of a transistor TR2 of which the emitter is grounded and the collector is connected to the emitter of the transistor TR1 through resistance R1. The base of the transistor TR1 is also connected via the zener diode Z to the junction of two equal capacitors C2 and C3, connected in series across the primary winding of the transformer T1. The zener voltage of the diode Z is chosen to be greater than any amplitude variation which appears on the primary voltage waveform during the forward stroke but is less than the voltage produced by the primary winding of the transformer T1 during retrace time. The base of the transistor TR2 is also connected to the collector of a transistor TR3, the emitter of which is connected to a suitable source of potential and whose base is connected to terminal 2 through capacitor C4; line pulses are applied to the terminal 2. The base of the transistor TR3 is connected to its emitter by means of the resistor R3. The transistors TR1, TR2, and TR3, are all of the N-P-N type.

In operation of the circuit during the forward stroke, an input waveform (*c*) is applied to the base of transistor TR1 through the diode D2 which conducts so that the transistor TR1 is operated as a linear amplifier with an emitter resistance R1 providing negative feedback. The linearity of the forward stroke of the output sawtooth waveform (*h*) can be controlled by variations in the shape of the input voltage waveform (*c*) because transistor TR1 acts as an amplifier and not a switch. The input voltage is at the same time applied via the series resistor R2 to the transistor TR2 which it causes just to bottom because of the relatively low voltage applied across its emitter collector path; a slight rise in the base voltage of transistor TR2 is necessary to maintain it bottomed as the current through the transistor as shown in waveform (*i*) rises during the forward stroke. During the retrace period the input waveform (*c*) becomes zero or negative thus tending to turn off the transistors TR1 and TR2 and causing a large positive voltage pulse as shown in waveform (*a*) to be generated at the lower end of the primary winding of the transformer T1 and a positive pulse of approximately half the magnitude to appear at the junction of the capacitors C2 and C3 as shown in waveform (*b*). The voltage of the pulse produced at the junction of capacitors C2 and C3 is in excess of the zener voltage of diode Z represented by the dotted line in waveform (*b*) and will therefore be applied to the base of the transistor TR1 appearing there as shown in waveform (*d*), the transistor TR1 operating as an emitter follower to set up a high voltage at its emitter, see waveform (*g*), equal to that of the pulse applied to its base. In this manner the voltage pulse, waveform (*a*), generated by the primary of the transformer T1 during retrace is shared substantially equally between the transistors TR1 and TR2. The diode D2 serves to isolate the previous stages and the base of transistor TR2 from the positive pulse passed by the zener diode Z. The zener diode Z conducts briefly at the end of the forward stroke to replenish that part of the charge on capacitors C2 and C3 which was used to turn on the transistor TR1 during the previous retrace. In order that the transistor TR2 can be turned off more rapidly at the end of the forward stroke a line pulse of positive polarity, as indicated by waveform (*f*), is applied via terminal 2 to the base of the transistor TR3 causing it to bottom at the commencement of the retrace period and connecting the base of transistor TR2 to a suitable source of potential, which rapidly removes the stored charge carries from the base, the waveform present on the base of transistor TR2 being represented by (*e*). The rapid turning off of the transistor TR2 reduces the losses in the resonant return during flyback of the current through the primary winding of the transformer T1. It also minimises the delay between the falling edge of the input voltage waveform and the actual start of collector current cut-off and therefore reduces the transient power dissipation in the junction thereby avoiding overheating of the transistors that might otherwise occur. The decay in the emitter current of the transistor TR2 in the absence of carrier removal from its base is as indicated by the dotted line in waveform (*i*). This, as will be appreciated by one skilled in the art, also improves the efficiency of the energy recovery circuit comprising the recovery diode D1 and the boost capacitor C1 because less energy is dissipated in the transistor TR2. At the end of the retrace of the sawtooth, the potential difference across the primary winding of the transformer T1 tends to reverse its polarity, but the energy recovery diode D1 conducts and is arranged to provide during conduction the initial portion of the forward stroke of the sawtooth waveform (*h*). The conduction of the diode D1 leads to the charging of the boost condenser C1 so that the voltage effective across the series arrangement of the transistors TR1 and TR2, the resistor R1 and the primary winding of the transformer T1 is greater than the voltage of the positive potential source.

It will be appreciated that the amplitudes of the waveforms (*a*), (*b*), (*c*) . . . (*i*) shown in the figure are not all to the same scale, the diagrams merely showing the shapes of the waveforms and their approximate relative timing.

It should be noted that the performance of other types of transistor line output circuits such as, for example, those employing a single transistor amplifier may be improved by the removal of stored charge carriers from the base by connection of the base to a suitable voltage supply via a transistor switched by a line pulse.

An advantage of the arrangement described above wherein a voltage pulse is derived from between a split tuning capacity of the resonant return circuit is that large circulating currents are not forced to flow in the boost capacitor C1 or in any decoupling capacitors thus avoiding the losses which such capacitors have at the currents and frequencies involved.

The present invention is not limited to an arrangement in which only one transistor is operating as a linear amplifier during the drive portion of the waveform the other merely acting as a switch and indeed it may in some circumstances be advantageous to arrange that both transistors operate in the linear mode during the drive portion of the waveform while sharing the retrace voltage between them.

What we claim is:

1. A circuit arrangement comprising an inductive load, a transistor amplifier connected in series with said load, and an input terminal connected to said amplifier to which an input signal can be applied to produce a sawtooth current in said load, wherein said transistor amplifier comprises two transistors each with base, emitter and collector electrodes and having their emitter-collector paths in series, there being provided means connected to said load for producing a voltage intermediate between the voltages at the ends of said load and means for applying said intermediate voltage to the base of one of said transistors so that the voltage produced across said load during the retrace of said sawtooth is shared between said transistors, said applying means being such as to isolate said point producing means from said base for at least part of the forward stroke of said sawtooth current.

2. A circuit according to claim 1 wherein said means for producing an intermediate voltage comprises two capacitors in series connected in parallel with said load.

3. A circuit according to claim 2 wherein said applying means comprises a zener diode connected from the junction of said capacitors to said base.

4. A circuit according to claim 1 wherein a diode is provided to connect said input terminal to said base.

5. A circuit according to claim 4 comprising a resistance in the emitter lead of said one transistor, whereby said one transistor is arranged to act as a substantially linear amplifier for said input signal during at least part of the forward stroke of said sawtooth.

6. A circuit according to claim 5 wherein the other of said transistors is arranged to be bottomed by said input signal during the forward stroke of said sawtooth waveform.

7. A circuit according to claim 6 comprising a further transistor, means for applying to said further transistor a signal related to said input signal, thereby to cause said further transistor to conduct during the retrace portions of said sawtooth current, said further transistor being connected from a suitable reference potential to said other transistor to remove stored charge carriers therefrom during said retrace portions.

8. A circuit according to claim 1 wherein said applying means comprises a zener diode connected from said producing means to said base.

9. A circuit according to claim 8 wherein a diode is provided to connect said input terminal to said base.

10. A circuit according to claim 9 comprising a further controllable semiconductor device, means for applying to said further controllable semiconductor device a signal related to said input signal, thereby to cause said further controllable semiconductor device to conduct during the retrace portions of said sawtooth current, said further controllable semiconductor device being connected from a suitable reference potential to said other controllable semiconductor device to remove stored charge carriers therefrom during said retrace portions.

11. A circuit arrangement for generating a sawtooth current in an inductive load comprising first and second transistors each having base, emitter and collector electrodes the emitter-collector paths of which are connected in a series combination with said load, a first input terminal for an input signal of sawtooth waveform, a diode connected from said first input terminal to the base of said first transistor, a resistor connected from said first input terminal to the base of said second transistor, first and second condensers connected in series across said load, and a zener diode connected from the junction of said condensers to the base of said first transistor, the arrangement being such that during the retrace portions of said sawtooth current the voltage set up across said inductive load is substantially equally divided between the emitter-collector paths of said first and second transistors.

12. An arrangement according to claim 11 comprising a further transistor having base, emitter and collector electrodes, the emitter collector path of which is connected from the base of said second transistors to a source of suitable reference voltage, a second input terminal connected to the base of said further transistor for applying to said further transistor an impulse waveform, thereby to cause said further transistor to conduct during the retrace portions of said sawtooth current, so as to remove stored charge carriers from the base of said second transistor at the beginning of said retrace portions.

References Cited by the Examiner

UNITED STATES PATENTS

| | | | |
|---|---|---|---|
| 2,957,993 | 10/1960 | Sichling | 307—88.5 |
| 3,056,064 | 9/1962 | Bourget | 315—27 |
| 3,178,593 | 4/1965 | Diehl | 307—88.5 |

FOREIGN PATENTS

| | | |
|---|---|---|
| 648,409 | 10/1962 | Canada. |
| 1,135,040 | 8/1962 | Germany. |
| 1,151,313 | 7/1963 | Germany. |

ARTHUR GAUSS, *Primary Examiner.*

JOHN W. HUCKERT, *Examiner.*

R. H. EPSTEIN, *Assistant Examiner.*